(12) United States Patent
Kim et al.

(10) Patent No.: US 7,700,935 B2
(45) Date of Patent: Apr. 20, 2010

(54) NON-VOLATILE MEMORY DEVICE AND METHOD OF FABRICATING THE SAME

(75) Inventors: Won-joo Kim, Hwaseong-si (KR); Suk-pil Kim, Yongin-si (KR); Yoon-dong Park, Yongin-si (KR); June-mo Koo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 194 days.

(21) Appl. No.: 11/882,694

(22) Filed: Aug. 3, 2007

(65) Prior Publication Data

US 2008/0123390 A1 May 29, 2008

(30) Foreign Application Priority Data

Nov. 28, 2006 (KR) ..................... 10-2006-0118559

(51) Int. Cl.
*H01L 47/00* (2006.01)
(52) U.S. Cl. ............................. 257/5; 257/4; 257/537; 257/E45.003; 257/E29.026; 365/148
(58) Field of Classification Search ................ 257/2–5, 257/324, 536–543, 544–550, E21.004, E29.005–E29.067, 257/E29.022, 3, 529, 530, E45.002; 438/95, 438/104, 238, 382–385, 536–543, 544–550; 365/46, 148
See application file for complete search history.

(56) References Cited

U.S. PATENT DOCUMENTS

| 2004/0256610 | A1* | 12/2004 | Lung ............................. 257/4 |
| 2006/0110877 | A1* | 5/2006 | Park et al. .................... 438/238 |
| 2008/0265235 | A1* | 10/2008 | Kamigaichi et al. ............ 257/2 |

* cited by examiner

*Primary Examiner*—Matthew C Landau
*Assistant Examiner*—Aaron Staniszewski
(74) *Attorney, Agent, or Firm*—Harness, Dickey & Pierce, P.L.C.

(57) ABSTRACT

A non-volatile memory device and a method of fabricating the same are provided. In the non-volatile memory device, at least one first semiconductor layer of a first conductivity type may be formed spaced apart from each other on a portion of a substrate. A plurality of first resistance variation storage layers may contact first sidewalls of each of the at least one first semiconductor layer. A plurality of second semiconductor layers of a second conductivity type, opposite to the first conductivity type, may be interposed between the first sidewalls of each of the at least one first semiconductor layer and the plurality of first resistance variation storage layers. A plurality of bit line electrodes may be connected to each of the plurality of first resistance variation storage layers.

13 Claims, 10 Drawing Sheets

NON-VOLATILE MEMORY DEVICE AND METHOD OF FABRICATING THE SAME

PRIORITY STATEMENT

This application claims the benefit of priority under 35 U.S.C. § 119 from Korean Patent Application No. 10-2006-0118559, filed on Nov. 28, 2006, in the Korean Intellectual Property Office, the disclosure of which is incorporated herein by reference in its entirety.

BACKGROUND

1. Field

Example embodiments relate to a semiconductor device and method of fabricating the same. Other example embodiments relate to a non-volatile memory device having a resistance variation storage layer and a method of fabricating the same.

2. Description of the Related Art

There has been an increasing demand for higher capacity mobile electronic devices. There also has been a demand for smaller-sized and high capacity electronic devices. As the size of the electronic devices decreases and the capacity increases, the more desirable it is to obtain non-volatile memory devices having a higher integration density and a higher capacity. The integration density of non-volatile memory devices formed from a highly-integrated pattern is restricted due to the limitations of photolithography technology.

For example, a non-volatile memory device using a resistance variation storage layer and a diode switch is desirable for obtaining a higher integration density because the non-volatile memory device has a smaller area per unit cell.

In the conventional art, the integration density of the non-volatile memory device in a single layer structure is restricted.

SUMMARY

Example embodiments relate to a semiconductor device and method of fabricating the same. Other example embodiments relate to a non-volatile memory device having a resistance variation storage layer and a method of fabricating the same.

Example embodiments also relate to a highly-integrated non-volatile memory device. Other example embodiments also relate to a method of more economically fabricating the highly-integrated non-volatile memory device.

According to example embodiments, there is provided a non-volatile memory device. In the non-volatile memory device, at least one first semiconductor layer having a first conductivity type is formed on (or contacts) a portion of a substrate. If two or more first semiconductor layers are formed, the first semiconductor layers are formed spaced apart from each other. A plurality of first resistance variation storage layers may be formed on (or covering) first sidewalls of each of the at least one first semiconductor layer. A plurality of second semiconductor layers having a second conductivity type, opposite to the first conductivity type, may be interposed between the first sidewalls of each of the at least one first semiconductor layer and the plurality first resistance variation storage layers. A plurality of bit line electrodes may be connected to each of the plurality of first resistance variation storage layers. The at least one first semiconductor and the plurality of second semiconductor layers may include an epitaxial layer in a single crystalline structure.

The non-volatile memory device may further include a plurality of second resistance variation storage layers formed on (or covering) second sidewalls of each of the at least one first semiconductor layer and a plurality of third semiconductor layers having the second conductivity type may be interposed (or formed) between the second sidewalls of each of the at least one first semiconductor layer and the plurality of second resistance variation storage layers. The plurality of first resistance variation storage layers and the plurality of second resistance variation storage layers may be alternately positioned.

According to example embodiments, there is provided a method of fabricating the non-volatile memory device. In the method, at least one first semiconductor layer having a first conductivity type may be formed on a portion of a substrate. If more than one first semiconductor layer is present, the first semiconductor layers may be spaced apart from each other. A plurality of second semiconductor layers having a second conductivity type, opposite to the first conductivity type, may be formed on (or covering) first sidewalls of each of the at least one first semiconductor layer. A plurality of first resistance variation storage layers may be formed on sidewalls of the plurality of second semiconductor layers. A plurality of bit line electrodes may be formed connected to each of the plurality of first resistance variation storage layers, respectively.

Formation of the at least one first semiconductor layer may include alternately stacking a plurality of first semiconductor layers and a plurality of sacrificial layers on the substrate; and forming a plurality of first pillar insulating layers spaced apart from one another, along (or parallel to) the first sidewalls of the plurality of first semiconductor layers.

The method of fabricating the non-volatile memory device may include removing the plurality of sacrificial layers after forming, the plurality of first pillar insulating layers.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

FIGS. 1A, 2A, 3A, 4A, 5A, 6A and 7 are diagrams illustrating plan views of a non-volatile memory device and a method of fabricating the same according to example embodiments;

FIG. 7 is a diagram illustrating a plan view of a non-volatile memory device according to example embodiments; and FIG. 8 is a diagram illustrating a plan view of a non-volatile memory device according to example embodiments.

DETAILED DESCRIPTION

Figure 1A:
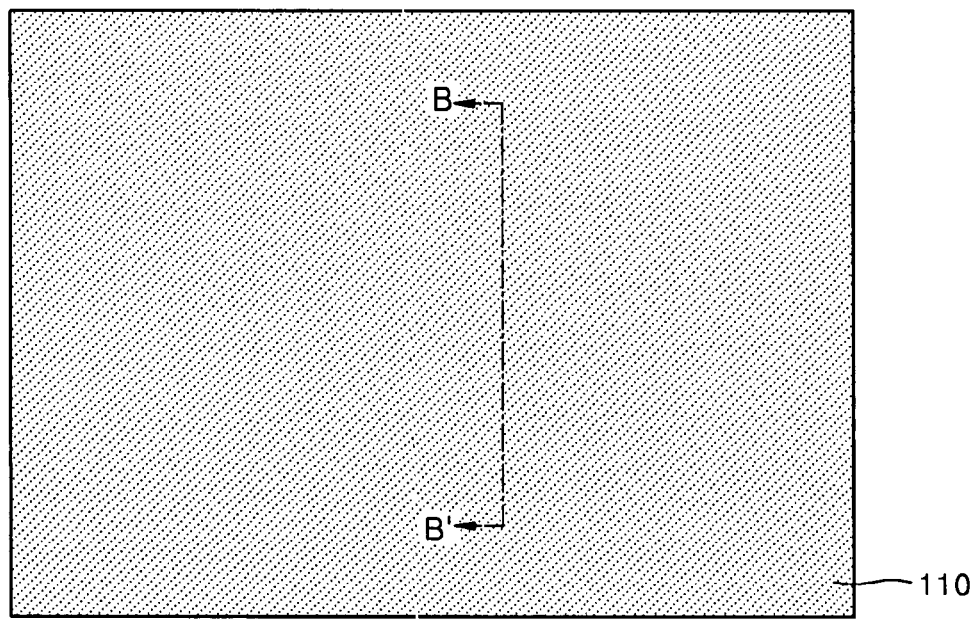

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a semiconductor device and method of fabricating the same. Other example embodiments relate to a non-volatile memory device having a resistance variation storage layer and a method of fabricating the same.

A non-volatile memory device according to example embodiments will be described with reference to FIGS. 6A, 6B, 6C and 7.

Figure 6A:
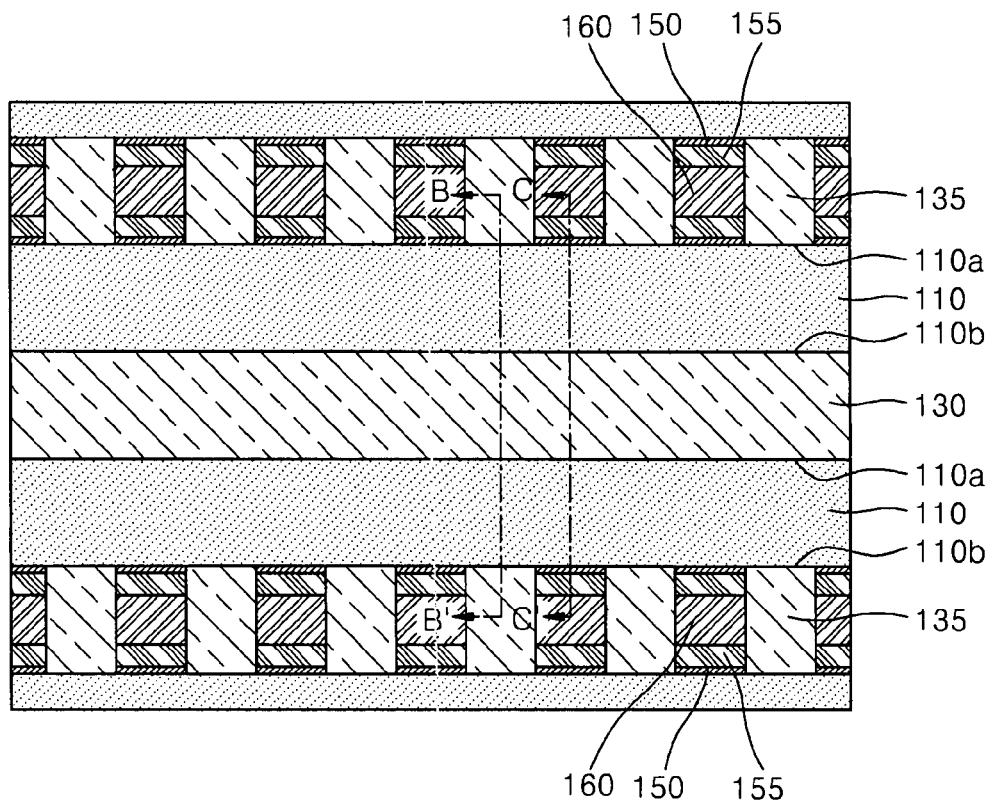
Figure 6B:
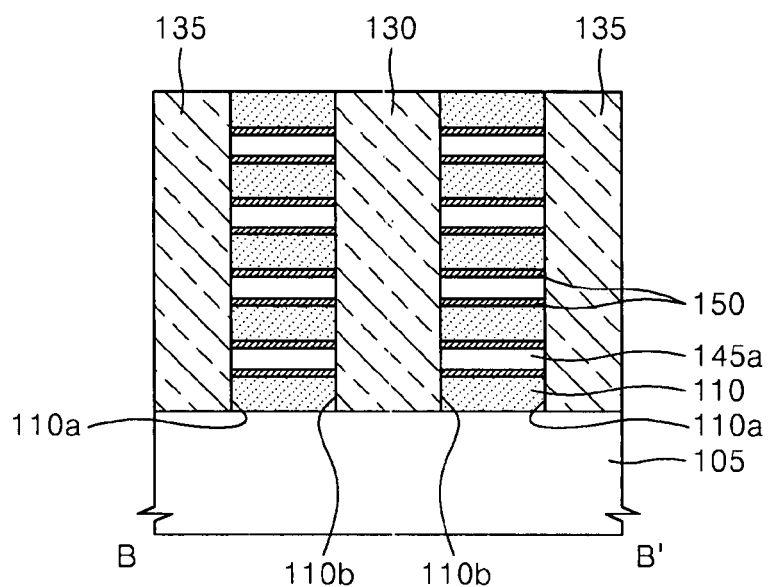
Figure 6C:
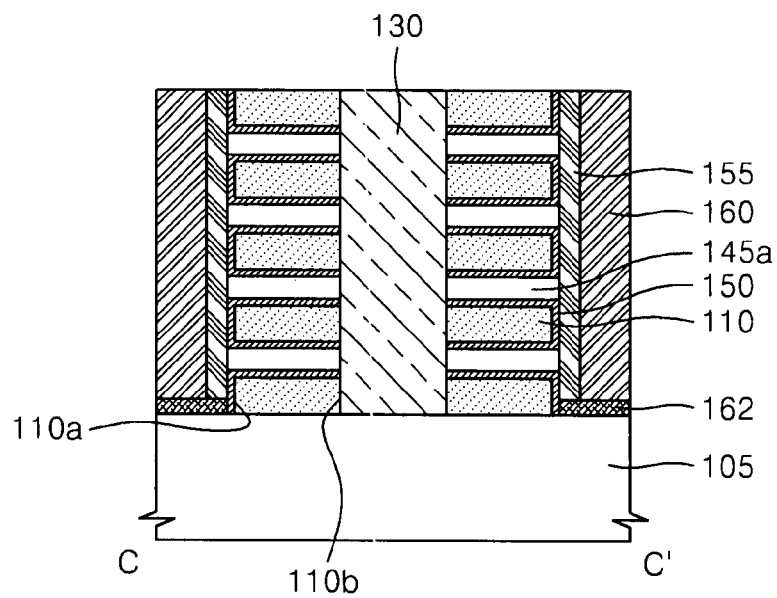
Figure 7:
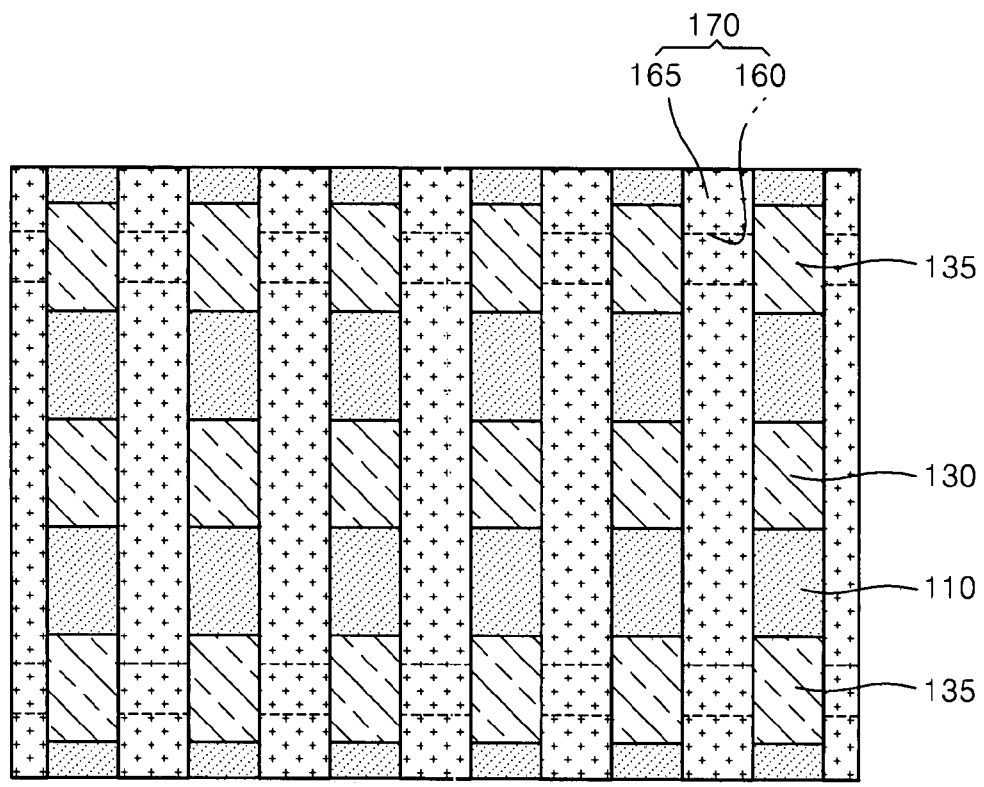

Referring to FIGS. 6A, 6B, 6C and 7, the non-volatile memory device may use a plurality of first resistance variation storage layers 155 to store data. A plurality of first semiconductor layers 110 may be used as a part (or portion) of a plurality of word line electrodes (not shown). A junction structure of the first semiconductor layers 110 and second semiconductor layers 150 may function as a diode switch. The first resistance variation storage layers 155 may be connected to a plurality of bit line electrodes 170 (as shown in FIG. 7). The word line electrodes may be provided in multilayers on a substrate 105 such that the integration density of the non-volatile memory device increases.

The first semiconductor layers 110 may be stacked on the substrate 105. The first semiconductor layers 110 may be spaced apart from one another. A void 145a may be defined by (or formed in) the space between the first semiconductor layers 110. The first semiconductor layers 110 may include an epitaxial layer (not shown) in a single crystalline structure. If the substrate 105 is bulk silicon in the single crystalline structure, then the first semiconductor layers 110 may include a silicon (Si) epitaxial layer grown on the substrate 105. The lowest layer of the first semiconductor layers 110 may include (or contact) a surface of the substrate 105. The number of the first semiconductor layers 110 may be selected based on the capacity of the non-volatile memory device. The first semiconductor layers 110 may be provided in a single layer. The number of the first semiconductor layers does not limit the scope of the example embodiments.

A plurality of first pillar insulating layers 135 may be formed on first sidewalls of the first semiconductor layers 110. The first pillar insulating layers 135 may be formed on a portion (or part) of the first sidewalls 110a of the first semiconductor layers 110 (as shown in FIG. 6a). The first pillar insulating layers 135 may be positioned apart (or spaced) from one another along (or parallel to) the first sidewalls 110a of the first semiconductor layers 110. The first pillar insulating layers 135 may protrude upward from the substrate 105.

A second pillar insulating layer 130 may be formed on second sidewalls 110b of the first semiconductor layers 110. The second sidewalls 110b of the first semiconductor layers 110 may be opposite to the first sidewalls 110a. The second pillar insulating layer 130 may extend along (or parallel to) the second sidewalls 110b of the first semiconductor layers 110. The second pillar insulating layer 130 may protrude upward from the substrate 105.

The second semiconductor layers 150 may be formed on (or covering) the first sidewalls 110a of the first semiconductor layers 110. The second semiconductor layers 150 may be formed on a portion (or part) of the first sidewalls 110a of the first semiconductor layers 110 between the first pillar insulating layers 135. The second semiconductor layers 150 may be formed on a top surface and a bottom surface of each first semiconductor layer 110.

The first semiconductor layers 110 and the second semiconductor layers 150 have (or form) a diode junction structure. The first semiconductor layers 110 may have a first conductivity type and the second semiconductor layers 150 may have a second conductivity type, which is opposite to the first conductivity type. The first conductivity type and the second conductivity type may be an n-type and a p-type, respectively, or vice versa. The second semiconductor layers 150 may include a silicon-germanium (SiGe) epitaxial layer.

The first resistance variation storage layers 155 may be formed along (or parallel to) the first sidewalls 110a of the first semiconductor layers 110. The second semiconductor layers 150 may be interposed between the first resistance variation storage layers 155 and the first semiconductor layers 110. The second semiconductor layers 150 may be interposed (or formed) between the first resistance variation storage layers 155 and the substrate 105. The first resistance variation storage layers 155 may extend inside voids 145a.

In the first resistance variation storage layers 155, the value of resistance changes depending on the value of electric power. The changed resistance value is maintained after the electric power is removed. If a desired value of the electric power is applied, then the resistance value of the first resistance variation storage layers 155 is restored to the original value. As such, data may be stored by changing the resistance value of the first resistance variation storage layers 155. Data is read by reading the resistance value of the first resistance variation storage layers 155. A first resistance variation storage layer 155 processes one bit of data.

The first resistance variation storage layers 155 may include NiO, $Nb_2O_5$, Cr doped $SrTiO_3$, $ZrO_x$, GST($GeSb_x$-$Te_y$), $TiO_2$, or HfO. If the resistance value is changed, then the first resistance variation storage layers 155 may be accompanied with a phase change or not. The non-volatile memory device may be a PRAM (phase change random access memory) or RRAM (resistance RAM).

The diode junction structure of the first and second semiconductor layers 110 and 150 functions as a switch such that a flow direction of the data is controlled. A diode junction structure and a first resistance variation storage layer 155 form a unit cell.

Each of the bit line electrodes 170 includes a plug portion 160 and a line portion 165. The plug portion 160 is positioned upward from the substrate 105 and extends across the first sidewall 110a of the first semiconductor layers 110. The plug portions 160 contact a sidewall of the first resistance variation storage layer 155. The line portion 165 may extend across a top of the first semiconductor layers 110. An interlayer insulating layer (not shown) may be further interposed between the line portion 165 and the top surface of the first semiconductor layer 110. A buffer insulating layer 162 may be interposed between the plug portion 160 and substrate 105. The buffer insulating layer 162 may be between the substrate 105 and the bottom surface of the first resistance variation storage layers 155.

Referring to FIG. 7, the first semiconductor layers 110 may be provided in a plurality of rows between the first pillar insulating layers 135 and the second pillar insulating layer 130. The first pillar insulating layers 135 and the second pillar insulating layer 130 are shared between the first semiconductor layers 110 in adjacent rows. The plug portions 160 that are positioned in the same column may be connected to the same bit line electrode 170. The non-volatile memory device according to example embodiments has an array structure in which the word lines are positioned in rows and the bit lines are positioned in columns.

In the non-volatile memory device according to example embodiments, the word lines may be positioned in a stack structure formed of the first semiconductor layers 110 in a multi-layer structure. The area of the unit cell may be reduced by positioning a plurality of the first resistance variation storage layers 155 on the first sidewalls 110a of the first semiconductor layers 110. The non-volatile memory device according to example embodiments may have a higher integration density by reducing the area of the unit cell and stacking the unit cells. The non-volatile memory device according to example embodiments may be used for processing higher capacity data.

The non-volatile memory device according to example embodiments may be capable of accessing a unit cell or a plurality of unit cells by selecting at least one bit line electrode 170 and selecting at least one word line (i.e., at least one first semiconductor layer 110). Random access to at least one unit cell is realized by using the non-volatile memory device according to example embodiments.

Figure 8:
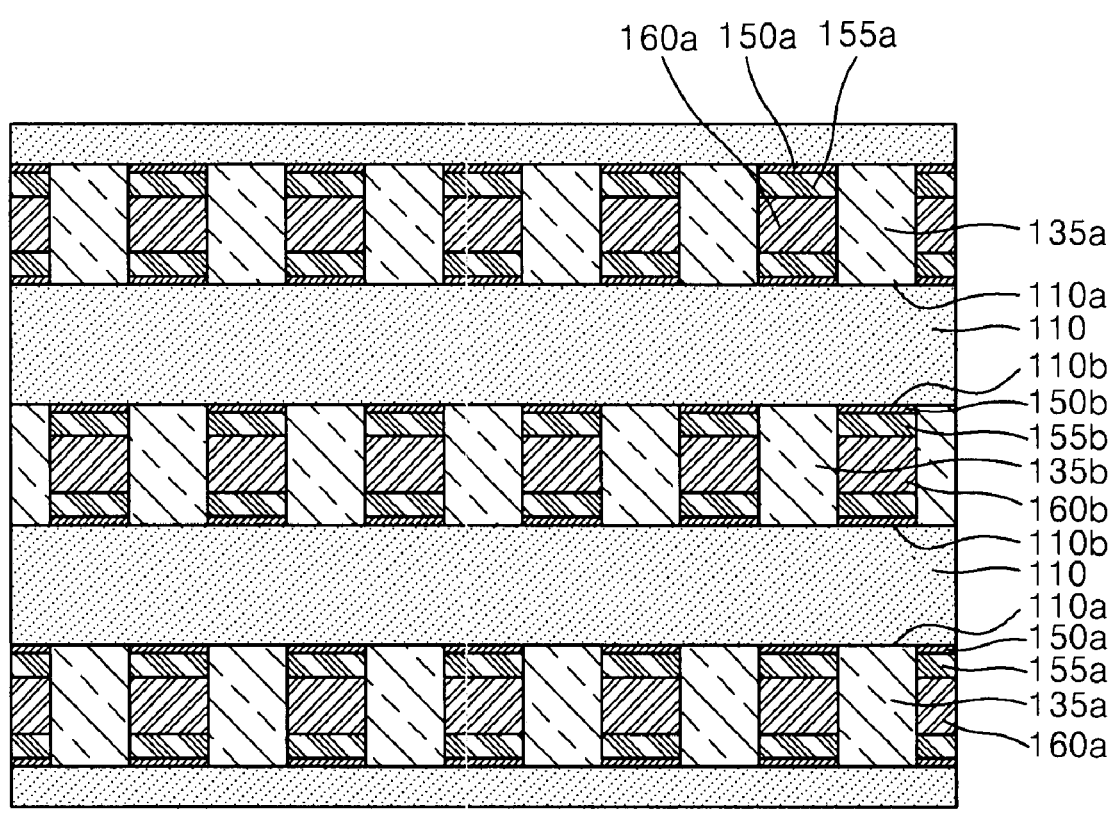

FIG. 8 is a diagram illustrating a plan view of a non-volatile memory device according to example embodiments. The non-volatile memory device is a modified example of the non-volatile memory device of FIG. 6A. Thus, a description of similar elements in FIGS. 6A and 8 will not be repeated for the sake of brevity. The non-volatile memory device according to example embodiments illustrated in FIG. 8 may be described with reference to FIGS. 6B, 6C and 7.

In FIG. 8, first pillar insulating layers 135a are positioned (or formed) along first sidewalls 110a of first semiconductor layers 110. Third pillar insulating layers 135b are positioned (or formed) along second sidewalls 110b of the first semiconductor layers 110. The third pillar insulating layers 135b and the first pillar insulating layers 135a are alternately positioned. The first pillar insulating layers 135a are similar to the first pillar insulating layers 135 in FIG. 6A. The third pillar insulating layers 135b are similar to the second pillar insulating layer 130 in FIG. 6A.

Second semiconductor layers 150a, first resistance variation storage layers 155a and first plug portions 160a may be positioned on the first sidewalls 110a of the first semiconductor layers 110 between the first pillar insulating layers 135a. Third semiconductor layers 150b, second resistance variation storage layers 155b and second plug portions 160b may be positioned on the second sidewalls 110b of the first semiconductor layers 110 between the third pillar insulating layers 135b. The first resistance variation storage layers 155a and the second resistance variation storage layers 155b may be alternately positioned. The first plug portions 160a and the second plug portions 160b may be alternately positioned.

The first plug portions 160a may be connected to line portions (e.g., line portions 165 of the bit line electrodes 170 of FIG. 7) and the second plug portions 160b may be further connected to other line portions (not shown). The line portions connected to the first plug portions 160a and the line portions connected to the second plug portions 160b may be positioned such that the line portions are not in contact with one another. The critical dimensions of the line portions may be reduced and/or the line portions may be positioned in different layers from one another.

The integration density of the non-volatile memory device in FIG. 8 may increase by about 2 times compared to the non-volatile memory device of FIG. 6A.

In the non-volatile memory device of FIG. 8, a void (e.g., void 145a of FIGS. 6B and 6C) may be filled with an insulating sacrificial layer (not shown). The second and third semiconductor layers 150a and 150b may be restricted to the sidewalls 110a and 110b of the first semiconductor layers 110. The insulating sacrificial layer may include an oxide layer.

A method of fabricating a non-volatile memory device according to example embodiments will be described with reference to FIGS. 1A through 7.

FIGS. 1A, 2A, 3A, 4A, 5A, 6A and 7 are diagrams illustrating plan views of a non-volatile memory device and a method of fabricating the same according to example embodiments. FIGS. 1B, 2B, 3B, 4B, 5B and 6B are diagrams illustrating sectional views taken along line B-B' of the non-volatile memory device of FIGS. 1A, 2A, 3A, 4A, 5A and 6A, respectively. FIGS. 2C, 3C, 4C, 5C and 6C are diagrams illustrating sectional views taken along line C-C' of the non-volatile memory device of FIGS. 2A, 3A, 4A, 5A and 6A, respectively.

Figure 1B:
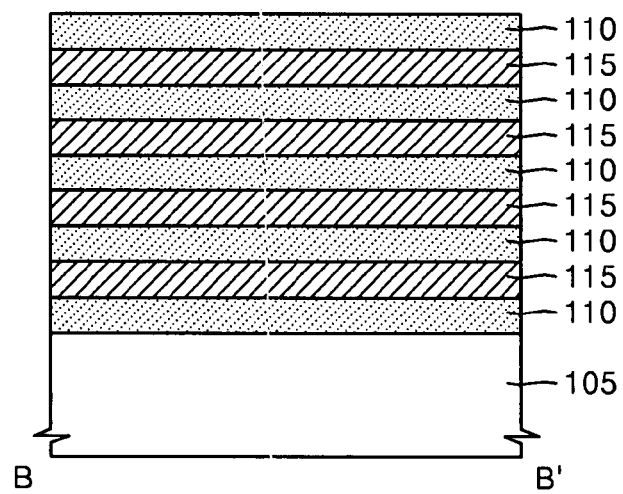
FIGS. 1B, 2B, 3B, 4B, 5B and 6B are diagrams illustrating sectional views taken along line B-B' of the non-volatile memory device of FIGS. 1A, 2A, 3A, 4A, 5A and 6A, respectively.

In FIGS. 1A and 1B, at least one first semiconductor layer 110 and at least one sacrificial layer 115 may be alternately formed on a substrate 105. The first semiconductor layers 110 may be spaced apart from each other by the sacrificial layers 115. The first semiconductor layers 110 and the sacrificial layers 115 may be stacked in a single layer or in multiple layers. The number of layers does not limit the scope of the example embodiments.

The substrate 105 may be bulk silicon in a single crystalline structure. The first semiconductor layers 110 may include a silicon epitaxial layer. The sacrificial layers 115 may include a silicon-germanium epitaxial layer. The first semiconductor layers 110 and the sacrificial layers 115 may be alternately grown as epitaxy on the substrate 105. The first semiconductor layers 110 and the sacrificial layers 115 may have a single crystalline structure. However, the example embodiments are not limited to a single crystalline structure.

Figure 2A:
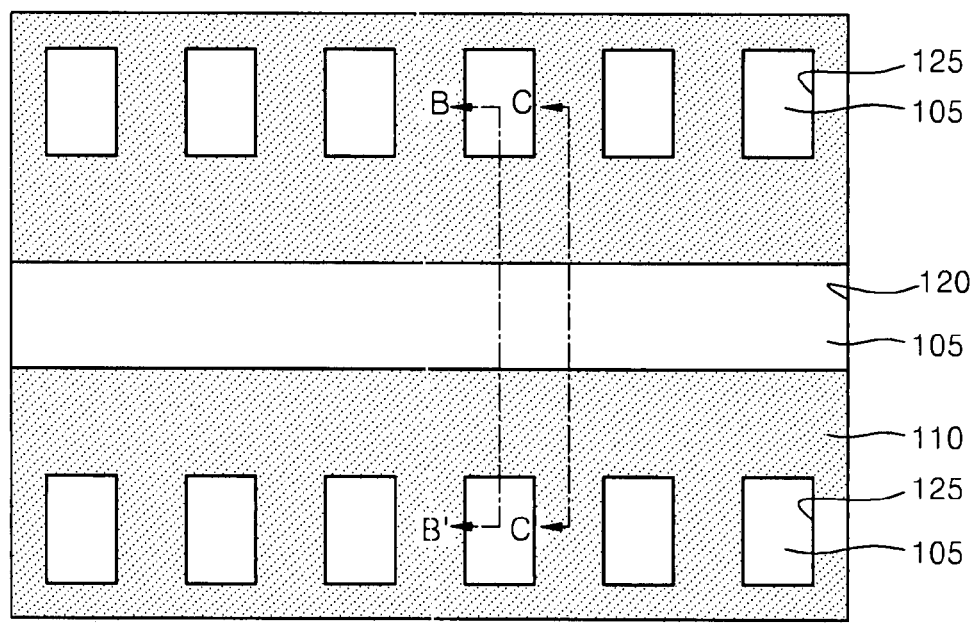
Figure 2B:
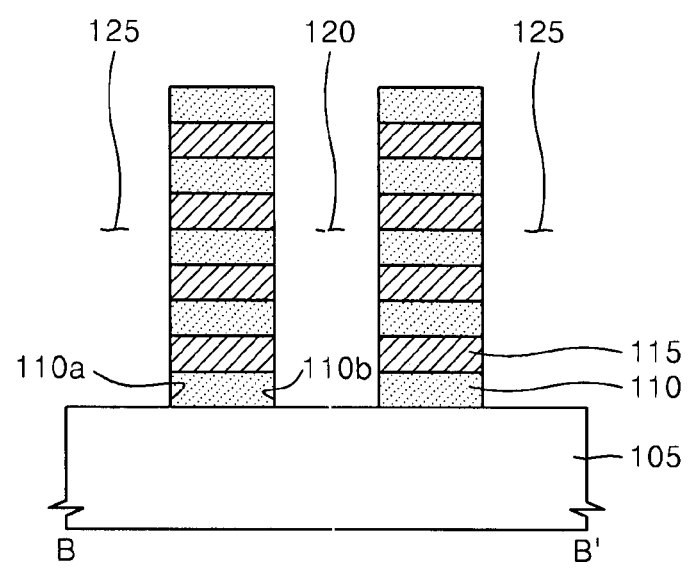
Figure 2C:
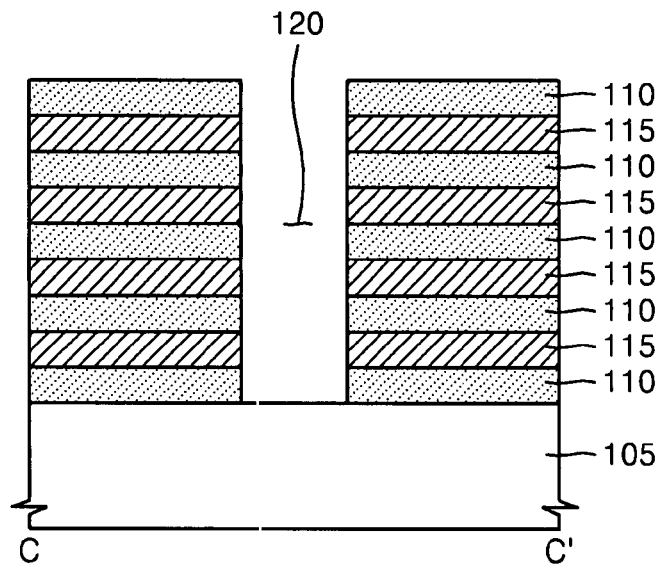
FIGS. 2C, 3C, 4C, 5C and 6C are diagrams illustrating sectional views taken along line C-C' of the non-volatile memory device of FIGS. 2A, 3A, 4A, 5A and 6A, respectively.

In FIGS. 2A, 2B and 2C, a plurality of first holes 125 may be such that parts of first sidewalls 110a of the first semiconductor layers 110 are exposed. Trench 120 may be formed to expose second sidewalls 110b of the first semiconductor layers 110. The first holes 125 and the trench 120 may be formed simultaneously or in an arbitrary order. The first holes 125 and the trench 120 may be positioned in a plurality of rows. The first semiconductor layers 110 may be partially positioned in rows. The first holes 125 and the trench 120 may be shared between the first and second sidewalls 110a and 110b of the first semiconductor layers 110 in adjacent rows.

The first holes 125 and the trench 120 may be formed using conventional lithography and etching technologies. The first holes 125 may be positioned (or formed) spaced apart from one another at desired intervals along the first sidewalls 110a of the first semiconductor layers 110. The second sidewalls 110b are defined by the trench 120. The first sidewalls 110a are partially defined (or formed) by the first holes 125. The first sidewalls 110a are defined (or formed) by a line to link the corners of the first holes 125 along the direction in which the first holes 125 are positioned.

The first semiconductor layers 110 may be doped with impurities of a first conductivity type through the first holes 125 and the trench 12. The first semiconductor layers 110 may be uniformly doped with impurities of the first conductivity type by ion implantation performed by a heat treatment. The first semiconductor layers 110 may be doped with the impurities of the first conductivity type in a deposition process. The first conductivity type may include an n-type or a p-type.

Figure 3A:
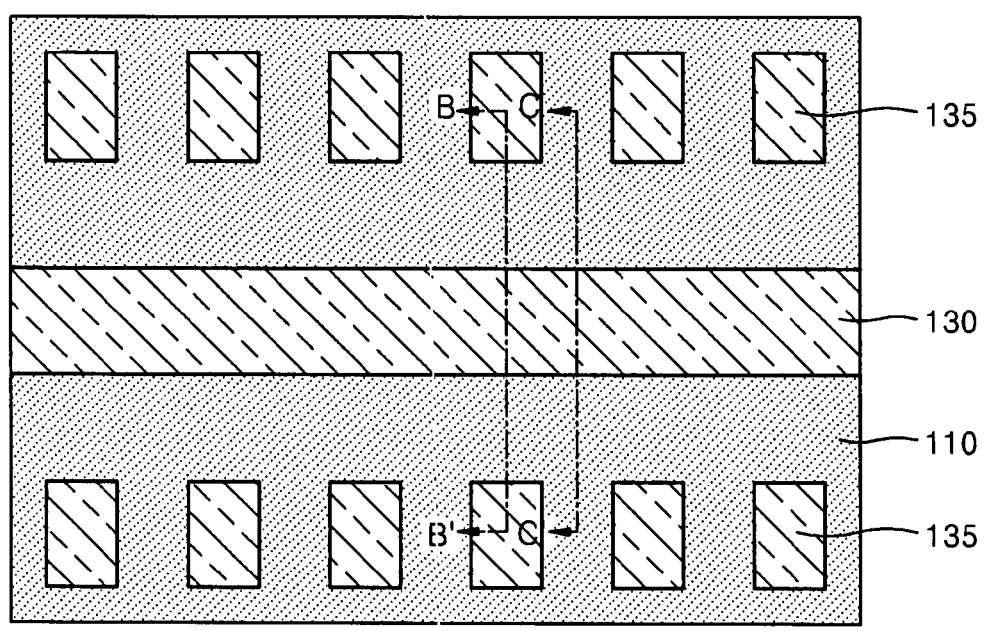
Figure 3B:
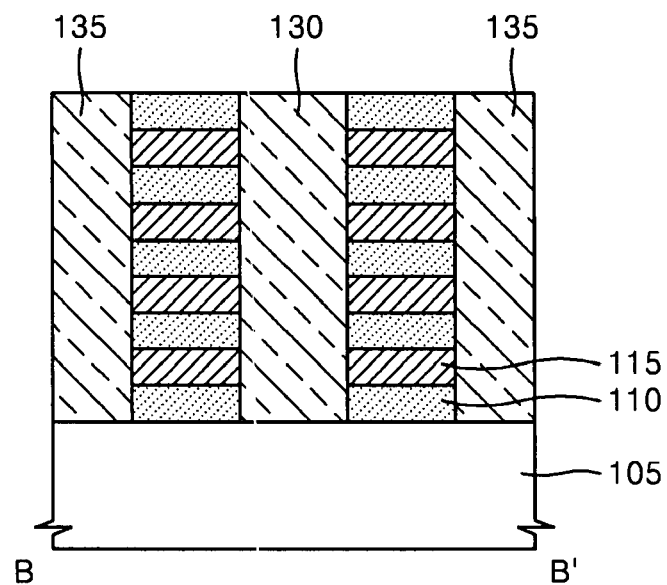
Figure 3C:
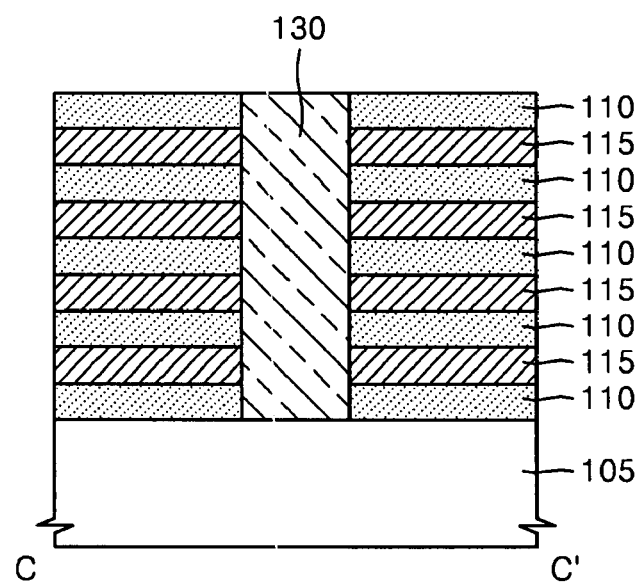

In FIGS. 3A, 3B and 3C, first pillar insulating layers 135 may fill (or be formed in) each of the first holes 125. A second pillar insulating layer 130 may fill (or be formed in) the trench 120. The first pillar insulating layers 135 and the second pillar insulating layer 130 may be formed simultaneously to reduce costs. According to other example embodiments, the first pillar insulating layers 135 and the second pillar insulating layer 130 are formed simultaneously in order to reduce costs. However, the first pillar insulating layers and the second pillar insulating layers may be formed in an arbitrary order. The first pillar insulating layers 135 and the second pillar insulating layer 130 may include a nitride layer (not shown).

After the nitride layer is formed in (or filling) the first holes 125 and the trench 120, the nitride layer is planarized such that the first pillar insulating layers 135 and the second pillar insulating layer 130 may be formed simultaneously.

Figure 4A:
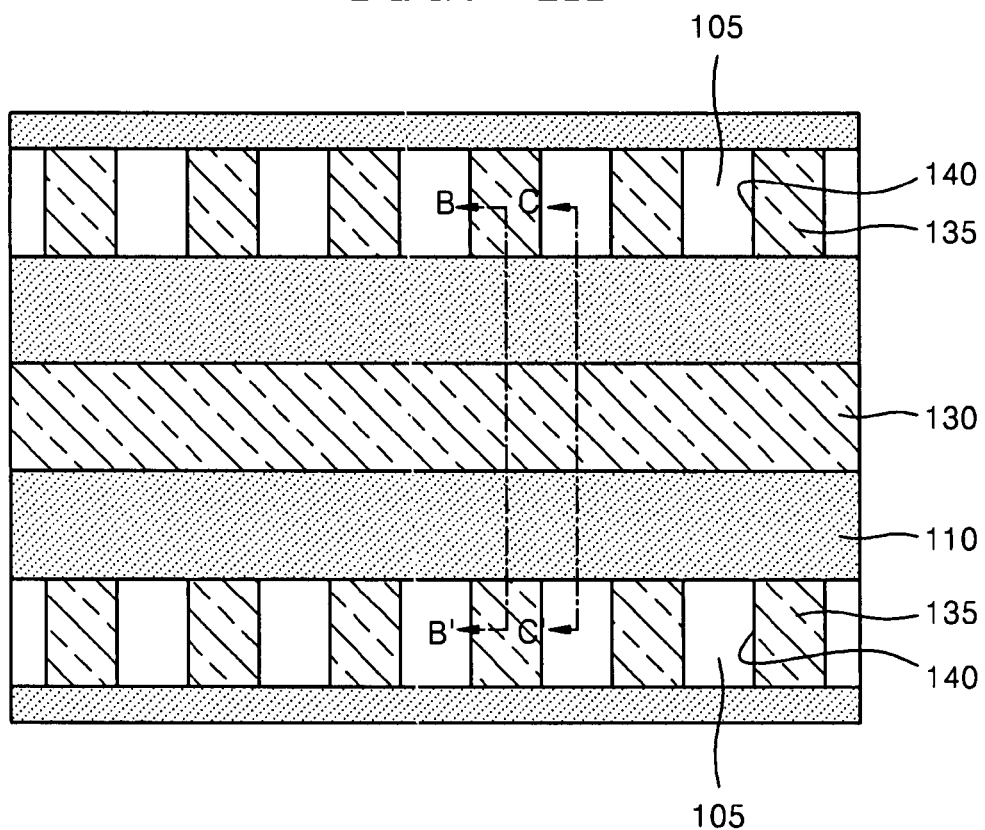
Figure 4B:
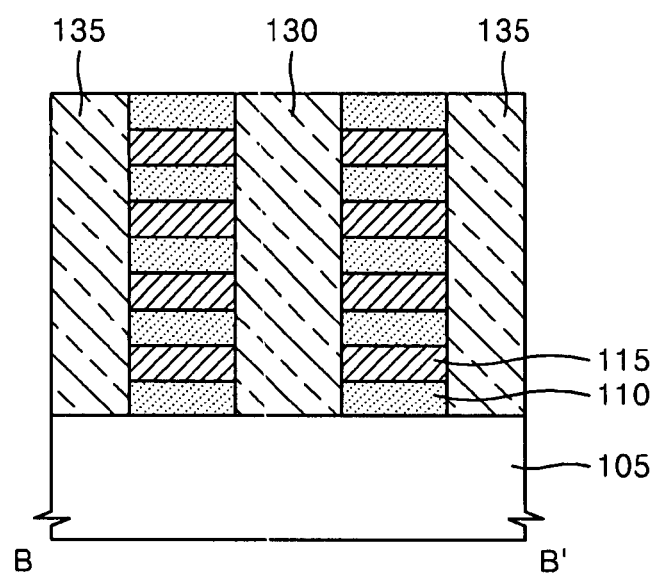
Figure 4C:
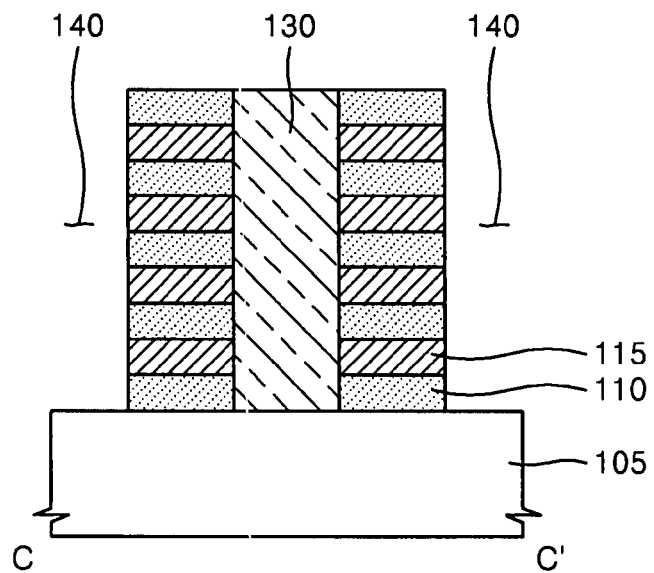

In FIGS. 4A, 4B and 4C, second holes 140 may be formed by more selectively etching portions (or parts) of the first semiconductor layers 110 positioned between the first pillar insulating layers 135. The first sidewalls 110a of the first semiconductor layers 110 may be exposed. The first semiconductor layers 110 may be spaced apart from one another in a row. The second holes 140 may be alternately positioned between the first pillar insulating layers 135. The second holes 140 may be defined by the first semiconductor layers 110.

The portions (or parts) of the first semiconductor layers 110, except for the second holes 140, may be covered by a mask layer (not shown). The exposed first semiconductor layers 110 may be etched using the mask layer, the first pillar insulating layers 135 and the second pillar insulating layer 130 as an etching protection layer such that the second holes 140 are formed.

Figure 5A:
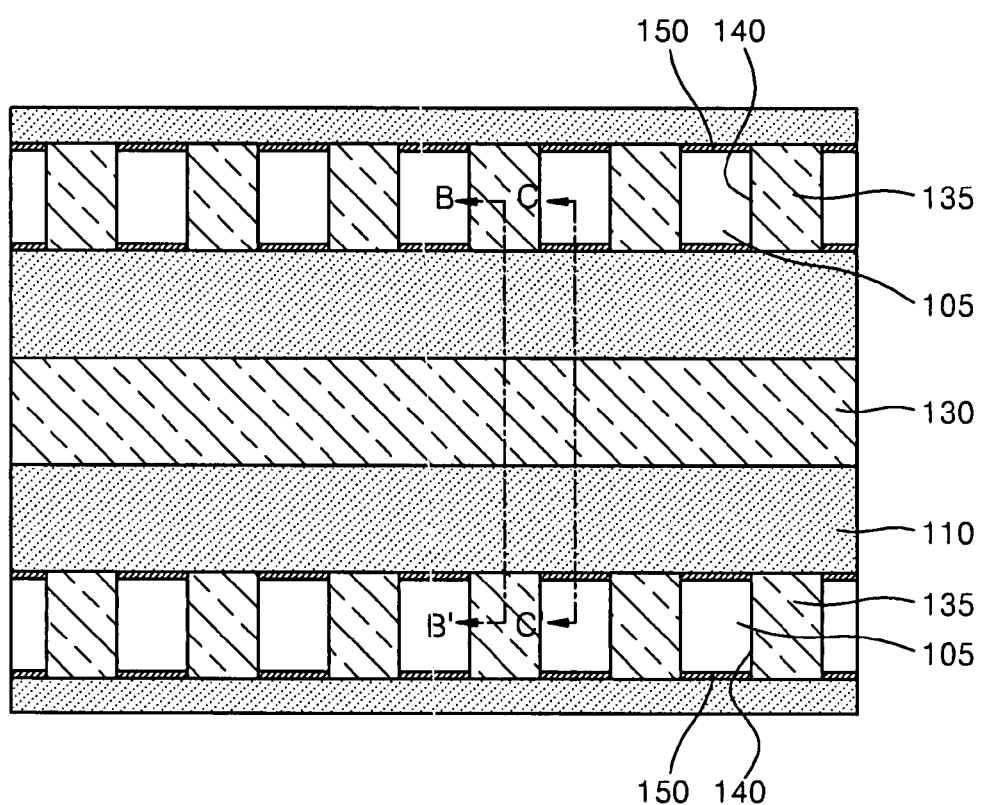
Figure 5B:
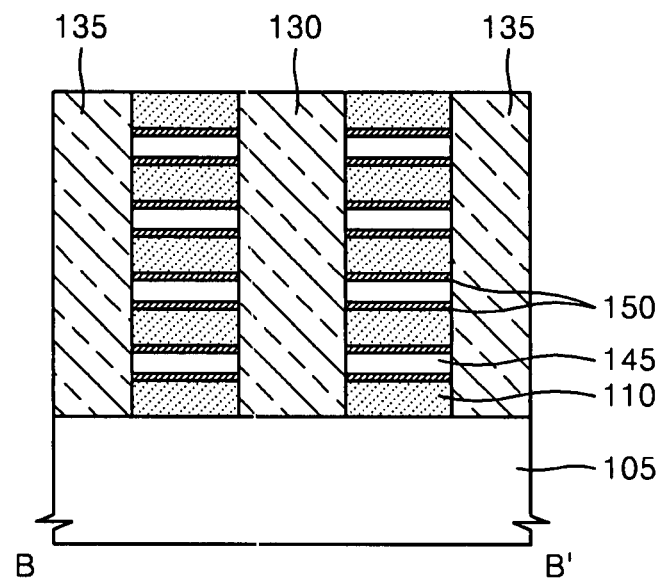
Figure 5C:
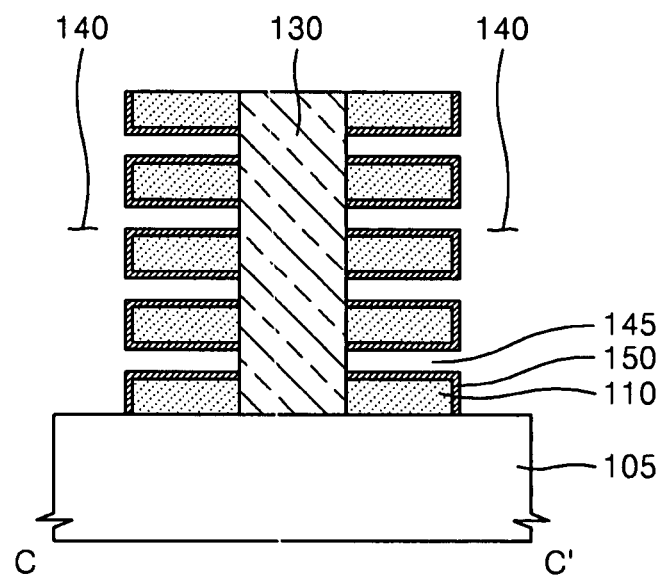

In FIGS. 5A, 5B and 5C, the sacrificial layers 115 may be selectively removed. The sacrificial layers 115 may be removed by isotropic etching. If an etchant solution is allowed (or flows) through the second holes 140, then the sidewalls of the sacrificial layers 115 exposed by the second holes 140 may be etched inward. If a wet etching technique is used, then the first semiconductor layers 110 of the silicon epitaxial layer and the sacrificial layers 115 of the silicon-germanium epitaxial layer have an etching selectivity of 1:200 or more.

Tunnels 145 are formed between the first semiconductor layers 110 if the sacrificial layers 115 are removed. One side of the tunnels 145 may be connected to the second holes 140. The second pillar insulating layer 130 may be formed on (or covering) the other side of the tunnels 145.

Second semiconductor layers 150 may be formed on (or covering) each of at least the first sidewalls 110a of the first semiconductor layers 110. The second semiconductor layers 150 may be formed using a chemical vapor deposition method. A reaction gas may be supplied to the first sidewalls 110a of the first semiconductor layers 110 through the second holes 145. The second semiconductor layers 150 may extend over (or cover) the top surfaces and bottom surfaces of the first semiconductor layers 110 depending on the deposition conditions. The second semiconductor layers 150 may be formed on the top surfaces of the upper (or highest) layer of the first semiconductor layers 110.

The second semiconductor layers 150 may be formed as a silicon epitaxial layer of a second conductivity type, which is opposite to the first conductivity type. The first semiconductor layers 110 and the second semiconductor layers 150 may form the diode junction structure (e.g., a p-n junction or n-p junction).

In FIGS. 6A, 6B and 6C, the first resistance variation storage layers 155 may be formed on the sidewalls of the second semiconductor layers 150. The first resistance variation storage layers 155 may be formed by supplying the reaction gas through the second holes 140. The first resistance variation storage layers 155 may extend across the stacked first semiconductor layers 110. The first resistance variation storage layers 155 may protrude upward from the substrate 105. The first resistance variation storage layers 155 may contact the second semiconductor layers 150. The first resistance variation storage layers 155 may extend inside the voids 145a.

A buffer insulating layer 162 may be formed on the substrate 105 exposed by the second holes before the first resistance variation storage layers 156 are formed.

Plug portions 160 connected to the first resistance variation storage layers 155 may be formed on the buffer insulating layer 162. After a conductive layer (not shown) is form in (or filling) the second holes 140 that are narrowed by the first resistance variation storage layers 155, the conductive layer may be planarized such that the plug portions 160 are formed. The conductive layer may include polysilicon, metal or metal silicide. The plug portions 160 may contact (or are shared between) the first resistance variation storage layers 155 formed along (or parallel to) the first sidewalls 110 of the first semiconductor layers 110 in adjacent rows.

In FIG. 7, line portions 165 may be formed connected to the plug portions 160. The line portions 165 may be formed across the top of the first semiconductor layers 110. The plug portions 160 and the line portions 165 form a portion (or part) of the bit line electrodes 170. An interlayer insulating layer (not shown) may be interposed between the line portions 165 and the top of the first semiconductor layers 110.

According to the example embodiments described above, a multi-layer unit cell structure is formed in a more economical method. The method of fabricating the non-volatile memory device according to the example embodiments may be applied to a method of fabricating the non-volatile memory device of FIG. 8. The trench 120 of FIGS. 2A, 2B and 2C may be substituted by a plurality of third holes (not shown). The third holes may be positioned such that the third holes; correspond to a region where the third pillar insulating layers 135 are formed. The third holds may be alternately positioned with the first holes 125. Subsequent processes, similar to FIGS. 3A through 6C may be performed. The bit line electrodes may be formed with reference to FIG. 7. The bit line electrodes may be positioned closely to connect the plug, portions 160a and 160b, or positioned in multi-layers.

In the method of fabricating the non-volatile memory device according to example embodiments, the sacrificial layers 115 may be substituted by insulating layers (e.g., oxide layers). In FIGS. 1A and 1B, the formation of the stack structure of the sacrificial layers 115 and the first semiconductor layers 110 may be performed with reference to the method of forming the silicon-on-insulator (SOI) structure. In FIGS. 5A, 5B and 5C, the selective etching of the sacrificial layers 115 may be omitted. The sacrificial layers 115 may remain without defining the tunnels (e.g., tunnel 145 of FIG. 5B) and the voids (e.g., void 145a of FIG. 6B). The second semiconductor layers 160 may be restricted to the sidewalls of the first semiconductor layers 110.

The non-volatile memory device according to example embodiments has a higher integration density by positioning (or forming) the first semiconductor layers in the multi-layer structure. As such, the non-volatile memory device may be used for processing higher capacity data.

If the non-volatile memory device according to example embodiments is used, then the random access to one or more unit cells may be realized.

The method of fabricating the non-volatile memory device according to example embodiments by simultaneously forming the unit cells in the multi-layer structure may reduce the costs associated with fabricating a non-volatile memory device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A non-volatile memory device, comprising:
   at least one first semiconductor layer of a first conductivity type formed on a portion of a substrate;
   a plurality of second semiconductor layers of a second conductivity type contacting a first sidewall of each of the at least one first semiconductor layer, wherein the second conductivity type is opposite to the first conductivity type;
a plurality of first resistance variation storage layers contacting a first sidewall of the plurality of second semiconductor layers, wherein the plurality of second semiconductor layers are interposed between the at least first semiconductor layer and the plurality of first resistance storage layers;
a plurality of bit line electrodes each connected to each of the plurality of first resistance variation storage layers; and
a first pillar insulating layer on the substrate, wherein the first pillar insulating layer is between the plurality of first resistance variation storage layers.

2. The non-volatile memory device of claim 1, wherein the at least one first semiconductor layer and the plurality of second semiconductor layers include an epitaxial layer in a single crystalline structure.

3. The non-volatile memory device of claim 2, wherein the substrate includes bulk silicon; and the epitaxial layer includes a silicon epitaxial layer.

4. The non-volatile memory device of claim 1, further comprising:
a second pillar insulating layer formed on the substrate, wherein the second pillar insulating layer contacts a second sidewall of the at least one first semiconductor layer.

5. The non-volatile memory device of claim 1, wherein the plurality of second semiconductor layers are formed on a top surface and a bottom surface of the at least one first semiconductor layer.

6. The non-volatile memory device of claim 1, further comprising:
a plurality of second resistance variation storage layers electrically contacting the second sidewall of the at least one first semiconductor layer; and
a plurality of third semiconductor layers interposed between the second sidewall of the at least one first semiconductor layer and the plurality of second resistance variation storage layers, wherein the plurality of third semiconductor layers are of the second conductivity type, and
wherein the plurality of first resistance variation storage layers and the plurality of second resistance variation storage layers are alternately positioned.

7. The non-volatile memory device of claim 6, further comprising:
a third pillar insulating layer formed on the substrate, wherein the third pillar insulating layer is interposed between the plurality of second resistance variation storage layers.

8. The non-volatile memory device of claim 1, wherein the at least one first semiconductor layer includes at least two first semiconductor layers spaced apart from one another.

9. The non-volatile memory device of claim 8, wherein voids are present between the at least two first semiconductor layers.

10. The non-volatile memory device of claim 8, further comprising insulating sacrificial layers interposed between the at least two first semiconductor layers.

11. The non-volatile memory device of claim 8, wherein each of the plurality of first resistance variation storage layers extends across the first sidewall of the at least two first semiconductors layers.

12. The non-volatile memory device of claim 11, wherein each of the plurality of bit line electrodes includes:
a plug portion extending across the first sidewall of the at least two first semiconductor layers, wherein the plug portion connects to each of the plurality of first resistance variation storage layers; and
a line portion connected to the plug portion, wherein the line portion extends across a top surface of the at least two first semiconductor layers.

13. The non-volatile memory device of claim 1, wherein the plurality of first resistance variation storage layers include at least one selected from the group consisting of NiO, $Nb_2O_5$, Cr doped $SrTiO_3$, ZrOx, GST($GeSb_xTe_y$), $TiO_2$ and HfO.

* * * * *